US012500191B2

(12) United States Patent
Clark

(10) Patent No.: US 12,500,191 B2
(45) Date of Patent: Dec. 16, 2025

(54) PHASE CHANGE INTERCONNECTS AND METHODS FOR FORMING THE SAME

(71) Applicant: Tokyo Electron Limited, Tokyo (JP)

(72) Inventor: Robert D. Clark, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 574 days.

(21) Appl. No.: 17/849,393

(22) Filed: Jun. 24, 2022

(65) Prior Publication Data
US 2023/0058704 A1 Feb. 23, 2023

Related U.S. Application Data

(60) Provisional application No. 63/235,417, filed on Aug. 20, 2021.

(51) Int. Cl.
*H01L 23/00* (2006.01)
(52) U.S. Cl.
CPC .............. *H01L 24/08* (2013.01); *H01L 24/05* (2013.01); *H01L 24/80* (2013.01); *H01L 2224/05605* (2013.01); *H01L 2224/05609* (2013.01); *H01L 2224/05611* (2013.01); *H01L 2224/05617* (2013.01); *H01L 2224/0562* (2013.01); *H01L 2224/05638* (2013.01); *H01L 2224/05639* (2013.01); *H01L 2224/08145* (2013.01); *H01L 2224/80895* (2013.01); *H01L 2224/80896* (2013.01); *H01L 2924/01007* (2013.01); *H01L 2924/01008* (2013.01); *H01L 2924/01016* (2013.01); *H01L 2924/01032* (2013.01); *H01L 2924/01034* (2013.01); *H01L 2924/01052* (2013.01)

(58) Field of Classification Search
CPC .......... H01L 24/08; H01L 24/05; H01L 24/80
See application file for complete search history.

(56) References Cited

U.S. PATENT DOCUMENTS

| | | | | |
|---|---|---|---|---|
| 2003/0169137 A1* | 9/2003 | Wyeth | ...................... | H01P 1/127 335/78 |
| 2004/0262635 A1* | 12/2004 | Lee | ........................ | H10D 30/69 257/199 |
| 2008/0303014 A1* | 12/2008 | Goux | .................... | H10N 70/043 438/102 |
| 2022/0013502 A1* | 1/2022 | Lee | ...................... | H01L 23/5385 |
| 2022/0310908 A1* | 9/2022 | Chen | .................... | H10N 70/231 |

* cited by examiner

*Primary Examiner* — Michael Jung
(74) *Attorney, Agent, or Firm* — Foley & Lardner LLP

(57) ABSTRACT

A structure of a semiconductor package is disclosed. The structure includes a first substrate including a first interconnect structure. The structure includes a second substrate including a second interconnect structure, the second substrate bonded to the first substrate. The structure includes a connection pad interposed between the first interconnect structure and the second interconnect structure. The connection pad includes a material configured to switch between a high resistance state and a low resistance state. The material of the connection pad includes a phase change material.

20 Claims, 7 Drawing Sheets

PHASE CHANGE INTERCONNECTS AND METHODS FOR FORMING THE SAME

CROSS-REFERENCE TO RELATED APPLICATIONS

The present application claims the benefit of and priority to U.S. Provisional Patent Application No. 63/235,417, filed Aug. 20, 2021, and entitled "Phase Change Interconnects," the contents of which is incorporated by reference in its entirety for all purposes.

FIELD OF THE DISCLOSURE

This disclosure relates to microelectronic devices including semiconductor devices, transistors, and integrated circuits, including methods of microfabrication.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed, and greater bandwidth, as well as lower power consumption and latency has grown recently, there has grown a need for smaller and more creative packaging techniques of semiconductor dies.

Wafer-to-wafer and chip-to-chip bonding is being implemented to continue Power-Performance-Area-Cost (PPAC) scaling for complex circuits such as are implemented in Systems on Chip (SOCs). Many bonding techniques utilize oxide-to-oxide bonding adhesion and forming integrated interconnect structures through a hybrid bonding technique that enables interconnections to be formed at the bond interface between two wafers or dies. However, current technologies typically form a permanent electrical connection between the respective interconnect structures of bonded wafers/dies. Stated another way, the existing interconnect structures of bonded wafers/dies are not capable of being switched between a connected state and a disconnected state.

SUMMARY

The present disclosure provides various embodiments of respective interconnect structures of two wafers (or dies) that can be electrically connected or disconnected after the two wafers are bonded. For example, a connection pad, including a phase change material, is formed over an exposed surface of each of the interconnect structures. After bonding the two wafers through connecting the respective connection pads to each other, some of the connection pads can be changed to a high resistance state so as to electrically disconnect the corresponding interconnect structures; and some of the connection pads can be changed to a lower resistance state so as to electrically connect the corresponding interconnect structures. In this way, arrangement of the interconnect structures of two wafers can be more flexibly designed.

One aspect of the present disclosure is directed to a structure of a semiconductor package. The structure includes a first substrate including a first interconnect structure; a second substrate including a second interconnect structure, the second substrate bonded to the first substrate; and a connection pad interposed between the first interconnect structure and the second interconnect structure. The connection pad includes a material configured to switch between a first (e.g., high) resistance state and a second (e.g., low) resistance state. The material of the connection pad includes a phase change material.

The phase change material of the connection pad may be selected from the group consisting of: a binary system of Ga—Sb, In—Sb, In—Se, Sb—Te, Ge—Te, and Ge—Sb. The phase change material of the connection pad may be selected from the group consisting of: a ternary system of Ge—Sb—Te, In—Sb—Te, Ga—Se—Te, Sn—Sb—Te, In—Sb—Ge, and Ga—Sb—Te. The phase change material of the connection pad may be selected from the group consisting of: a quaternary system of Ag—In—Sb—Te, Ge—Sn—Sb—Te, Ge—Sb—Se—Te, Te—Ge—Sb—S, Ge—Sb—Te—O, and Ge—Sb—Te—N.

At least one of the first interconnect structure or the second interconnect structure is configured to provide Joule heating to the connection pad so as to cause the connection pad to switch between the first resistance state and the second resistance state.

At least one of the first interconnect structure or the second interconnect structure is configured to apply a current to the connection pad, causing the connection pad to transition to a crystalline phase. The current anneals the connection pad at a temperature above a crystallization temperature of the material but below a melting temperature of the material.

At least one of the first interconnect structure or the second interconnect structure is configured to apply a current to the connection pad, causing the connection pad to transition to an amorphous phase. The current anneals the connection pad at a temperature higher than a melting temperature of the material.

The first substrate further includes a first dielectric layer embedding the first interconnect structure and a first portion of the connection pad, and the second substrate further includes a second dielectric layer embedding the second interconnect structure and a second portion of the connection pad.

Another aspect of the present disclosure may be directed to a structure of a semiconductor package. The structure includes a first substrate including a first dielectric layer that embeds a first interconnect structure; a second substrate including a second dielectric layer that embeds a second interconnect structure; and a connection pad having a first portion embedded in the first dielectric layer and a second portion embedded in the second dielectric layer. A first surface of the first portion is in contact with the first interconnect structure and a first surface of the second portion is in contact with the second interconnect structure, and respective second surfaces of the first and second portions are in contact with each other. The connection pad includes a phase change material. The first dielectric layer is contact with the second dielectric layer.

The phase change material of the connection pad may be selected from the group consisting of: a binary system of Ga—Sb, In—Sb, In—Se, Sb—Te, Ge—Te, and Ge—Sb. The phase change material of the connection pad may be selected from the group consisting of: a ternary system of Ge—Sb—Te, In—Sb—Te, Ga—Se—Te, Sn—Sb—Te, In—Sb—Ge, and Ga—Sb—Te. The phase change material of the connection pad may be selected from the group consisting of: a quaternary system of Ag—In—Sb—Te, Ge—Sn—

Sb—Te, Ge—Sb—Se—Te, Te—Ge—Sb—S, Ge—Sb—Te—O, and Ge—Sb—Te—N.

At least one of the first interconnect structure or the second interconnect structure is configured to provide Joule heating to the connection pad so as to cause the connection pad to switch between a first resistance state and a second resistance state.

Yet another aspect of the present disclosure may be directed to a method for fabricating a semiconductor package. The method includes providing a first substrate including a first interconnect structure; forming a first connection pad over the first interconnect structure, wherein the first connection pad includes a phase change material; providing a second substrate including a second interconnect structure; forming a second connection pad over the second interconnect structure, wherein the second connection pad also includes the phase change material; and bonding the first substrate to the second substrate through connecting the first connection pad to the second connection pad.

The method further includes applying a current through at least one of the first interconnect structure or the second interconnect structure to transition the connected first and second connection pads to a lower resistance state, thereby electrically connecting the first interconnect structure to the second interconnect structure.

The method further includes applying a current through at least one of the first interconnect structure or the second interconnect structure to transition the connected first and second connection pads to a higher resistance state, thereby electrically disconnecting the first interconnect structure from the second interconnect structure.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
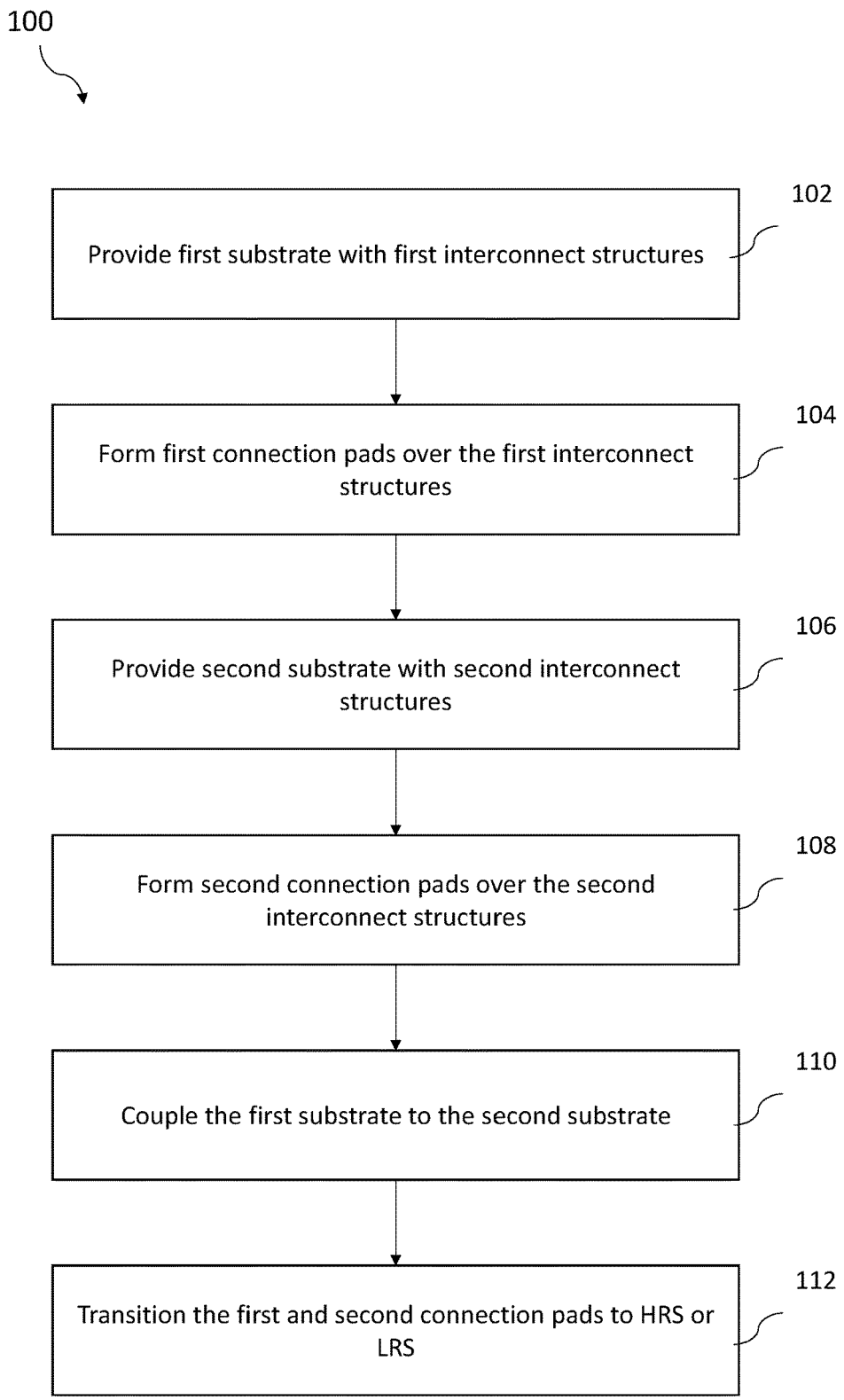
FIG. 1 illustrates a flow chart of an example method for making a semiconductor package, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

According to one implementation, a reconfigurable interconnect is provided utilizing a phase change material (PCM). The PCM may have relatively high resistance when placed in an amorphous state/phase and lower resistance when placed in a crystalline state/phase. To render the material non-conductive, a high amplitude electric pulse may be applied such that the material reaches a melting point and is then rapidly quenched to reach and lock in an amorphous phase. A relatively longer, low amplitude electric pulse may be applied such that the material reaches only the crystallization point and is given time to crystallize. This process allows the material to change from the amorphous phase to the crystalline phase. These two processes may be repeatedly controlled to switch the material between a conductive state and a non-conductive state.

According to various embodiments of the present disclosure, incorporating a PCM into an interconnect structure allows a circuit to be altered as needed for a given operational need. For example, a circuit block may be alternately enabled or disabled to reduce power consumption, heat, etc. The interconnect structure may span over a bonding surface such that the PCM may be at or below the bonding interface between the substrates (e.g., wafers). Thus, a PCM could be provided at or on the surface of one or both of the substrates to provide the reconfigurable functionality. A ternary system of germanium-antimony-tellurium (Ge—Sb—Te, sometimes referred to as GST) is one example material that can be used for the PCM and may also optionally serve as metal-to-metal bond, though other materials may additionally or alternatively be utilized. For example, the PCM may include a binary system of Ga—Sb, In—Sb, In—Se, Sb—Te, Ge—Te, Ge—Sb, or combinations thereof. In another example, the PCM may include other ternary system of In—Sb—Te, Ga—Se—Te, Sn—Sb—Te, In—Sb—Ge, Ga—Sb—Te, or combinations thereof. In yet another example, the PCM may include a quaternary system of Ag—In—Sb—Te, Ge—Sn—Sb—Te, Ge—Sb—Se—Te, Te—Ge—Sb—S, Ge—Sb—Te—O, Ge—Sb—Te—N, or combinations thereof.

FIG. 1 illustrates a flowchart of an example method 100 for forming a semiconductor package having a PCM between respective interconnect structures of two coupled (e.g., bonded) wafers or dies. It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with cross-sectional views of an example semiconductor package 200 at various fabrication stages as shown in FIGS. 2 to 7, respectively, which will be discussed in further detail below. It should be understood that the semiconductor device 200, shown in FIGS. 2 to 7, may include a number of other devices such as inductors, fuses, capacitors, coils, etc., while remaining within the scope of the present disclosure.

Figure 2:
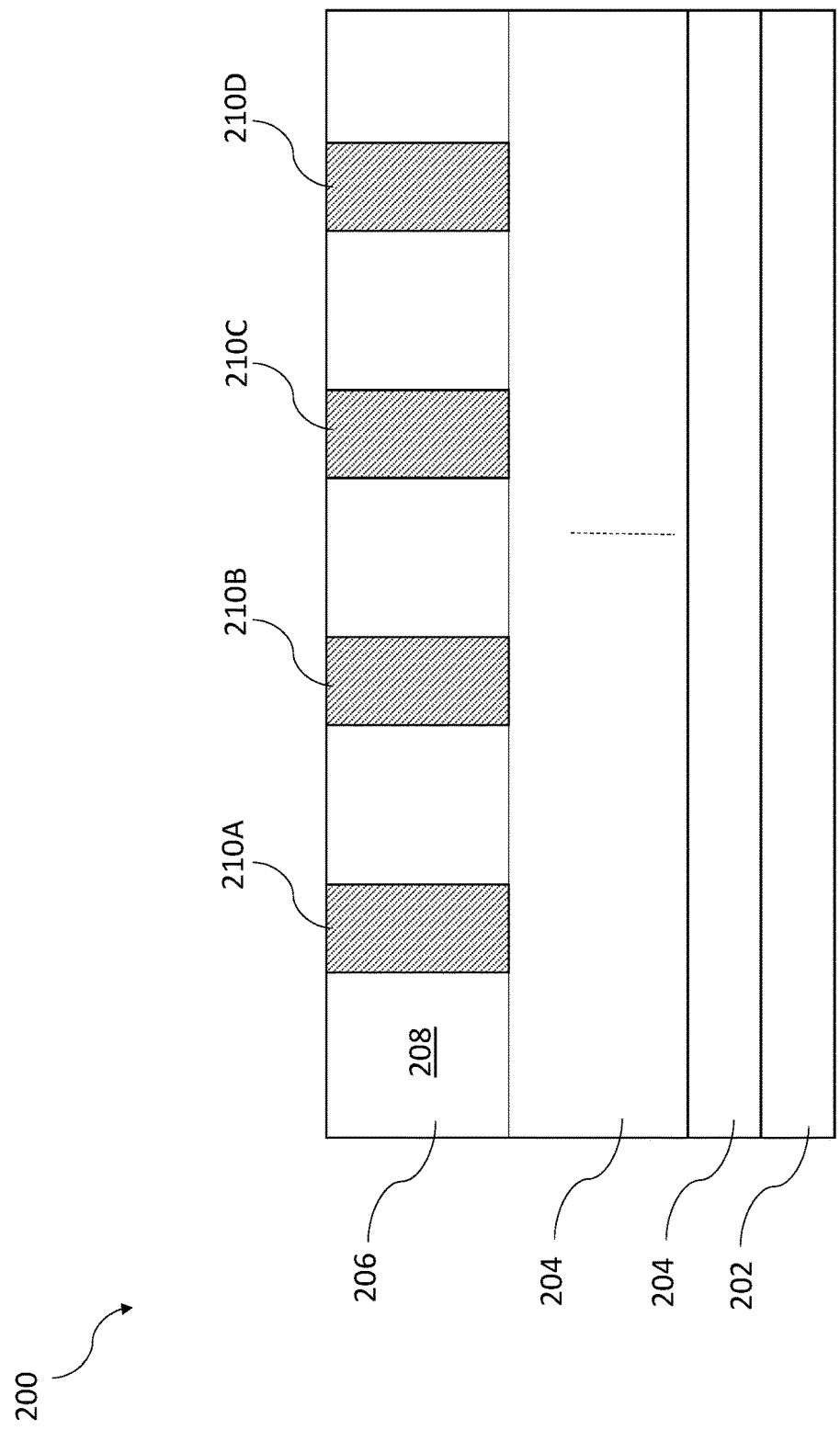
FIGS. 2 to 7 illustrate respective cross-sectional views of a semiconductor package during various fabrication stages, made by the method of FIG. 1, in accordance with some embodiments.

Corresponding to operation 102 of FIG. 1, FIG. 2 is a cross-sectional view of the semiconductor package 200 in which a first substrate 202 is provided with a number of first interconnect structures 210A, 210B, 210C, and 210D, at one of the various stages of fabrication, in accordance with various embodiments.

The first substrate 202 may be a semiconductor substrate, such as a bulk semiconductor, a semiconductor-on-insulator (SOI) substrate, or the like, which may be doped (e.g., with a p-type or an n-type dopant) or undoped. The first substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the first substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the first substrate 202 includes a number of device features (e.g., transistors, diodes, resistors, etc., which are not shown for the sake of clarity) formed along a (e.g., frontside) surface of the first substrate 202 and a number of interconnect structures (e.g., metal lines, metal vias, etc., which are not shown for the sake of clarity) formed over the device features. The interconnect structures are configured to electrically connect the device features to one another so as to form an integrated circuit, which can function as a logic device, a memory device, an input/output device, or the like. These interconnect structures (e.g., formed of conductive materials, such as Cu, Al, W, Ti, TiN, Ta, TaN, or multiple layers or combinations thereof) may be embedded in one or more dielectric layers (e.g., formed of low-k dielectric materials, such as $SiO_2$), which are sometimes referred to as metallization layers, e.g., 204. Alternatively stated, each metallization layer 204 can include a number of metal lines and a number of metal vias embedded therein. Over the (e.g., frontside) surface of the first substrate 202, a plural number of such metallization layers 204 can be formed.

Further, on a topmost one of the metallization layers, a bonding layer 206 is formed. In some embodiments, the bonding layer 206, formed of one or more low-k dielectric materials 208, such as $SiO_2$, has a number of first interconnect structures 210A to 210D disposed therein. The first interconnect structures 210A to 210D are formed using a damascene process, wherein the dielectric material 208 is deposited over the workpiece (e.g., the topmost metallization layer), and the dielectric material 208 is patterned using lithography. The patterned dielectric material 208 is filled with a conductive material, and excess portions of the conductive material are removed from over the top surface of the dielectric material 208 using a chemical mechanical polishing (CMP) process, an etch process, or combinations thereof. In other embodiments, a conductive material may be deposited and patterned using lithography, and the dielectric material 208 is formed over the conductive material to form the first interconnect structures 210A to 210D using a subtractive etch process. The excess dielectric material 208 is then removed from over the first interconnect structures 210A to 210D using a CMP process, an etch process, or combinations thereof.

Figure 3:
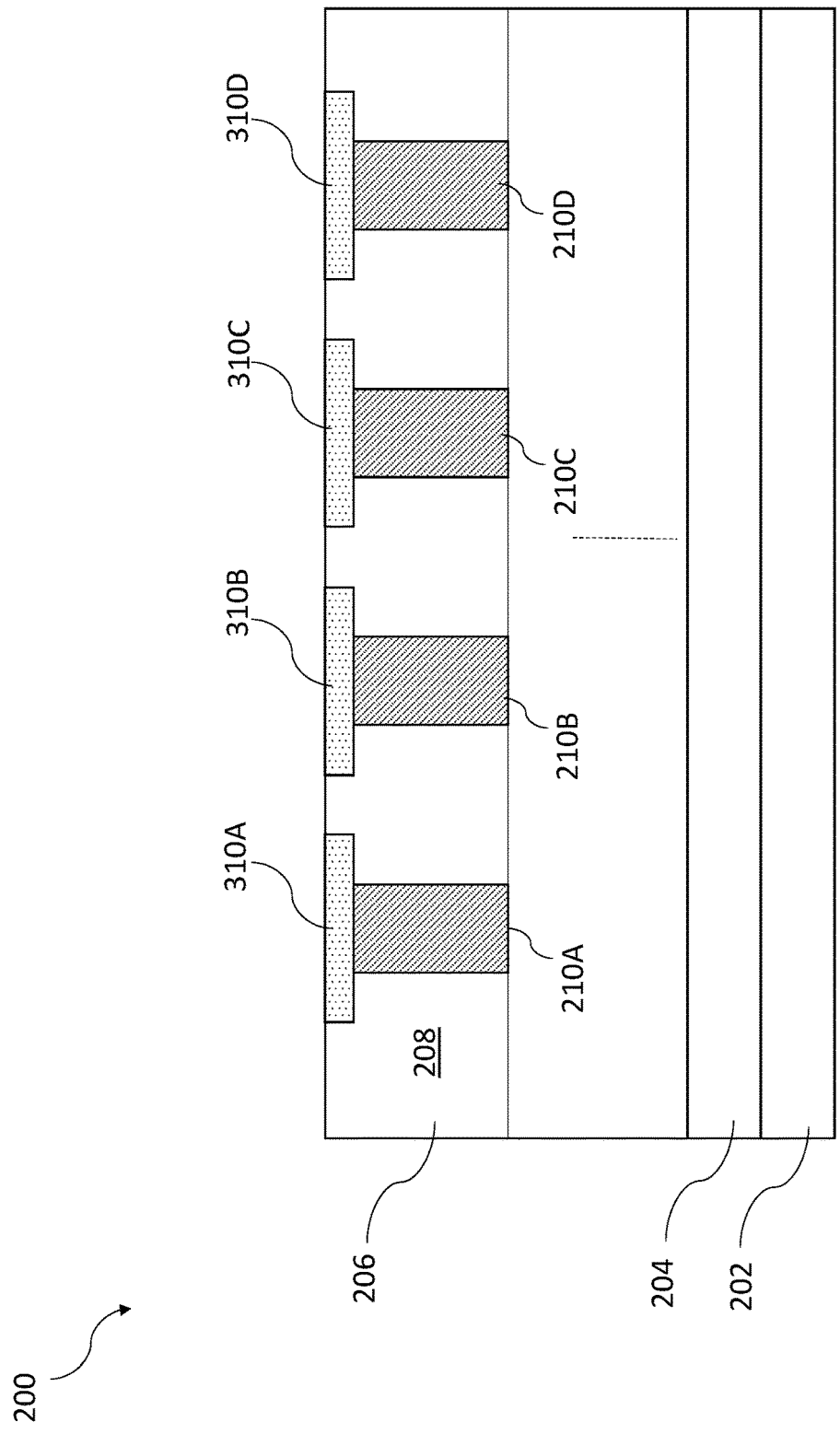

Corresponding to operation 104 of FIG. 1, FIG. 3 is a cross-sectional view of the semiconductor package 200 in which a number of first connection pads 310A, 310B, 310C, and 310D are formed over the first interconnect structures 210A, 210B, 210C, and 210D, respectively, at one of the various stages of fabrication, in accordance with various embodiments.

Following the formation of the first interconnect structures 210A to 210D, another damascene process may be performed to form the corresponding first connection pads 310A to 310D. For example, another thin layer of the dielectric material 208 may be deposited over the polished surface shared by the original dielectric material 208 and first interconnect structures 210A to 210D. Another patterning process is then performed on the later deposited dielectric material 208 to re-expose respective top surfaces of the dielectric material 208 by forming a number of recesses. Next, these recesses are filled with a PCM, followed by a CMP process, to form the first connection pads 310A to 310D. As such, a bottom surface of each of the first connection pads 310A to 310D can be in direct contact with the top surface of the corresponding first interconnect structure, and a top surface of each of the first connection pads 310A to 310D can be exposed for further connection. In other embodiments, after forming the first interconnect structures 210A to 210D, the first interconnect structures 210A to 210D may be etched to form a number of recesses, respectively, which are then filled with the PCM to form the first connection pads 310A to 310D. In some embodiments, the first substrate 202, the metallization layer(s) 204, and the bonding layer 206 (including the first connection pads 310A to 310D) may collectively be referred to a first semiconductor die.

In some embodiments, each of the first connection pads 310A to 310D may laterally extend beyond a sidewall of the corresponding one of the first interconnect structures 210A to 210D, as shown in FIG. 3. However, in some other embodiments, the first connection pads 310A to 310D may each have its sidewall vertically aligned with the sidewall of the corresponding first interconnect structure, while remaining within the scope of the present disclosure. Moreover, in some other embodiments, the first connection pads 310A to 310D may have a cross-section that is smaller than the corresponding one of the first interconnect structures 210A to 210D.

In various embodiments, the PCM of the first connection pads 310A to 310D can be switched between a high resistance state (HRS) and a low resistance state (LRS), or between a conductive state and a non-conductive state. For example, the first connection pads 310A to 310D may each include a binary system of Ga—Sb, In—Sb, In—Se, Sb—Te, Ge—Te, Ge—Sb, or combinations thereof. In another example, the first connection pads 310A to 310D may each include a ternary system of Ge—Sb—Te, In—Sb—Te, Ga—Se—Te, Sn—Sb—Te, In—Sb—Ge, Ga—Sb—Te, or combinations thereof. In yet another example, the first connection pads 310A to 310D may each include a quaternary system of Ag—In—Sb—Te, Ge—Sn—Sb—Te, Ge—Sb—Se—Te, Te—Ge—Sb—S, Ge—Sb—Te—O, Ge—Sb—Te—N, or combinations thereof.

Figure 4:
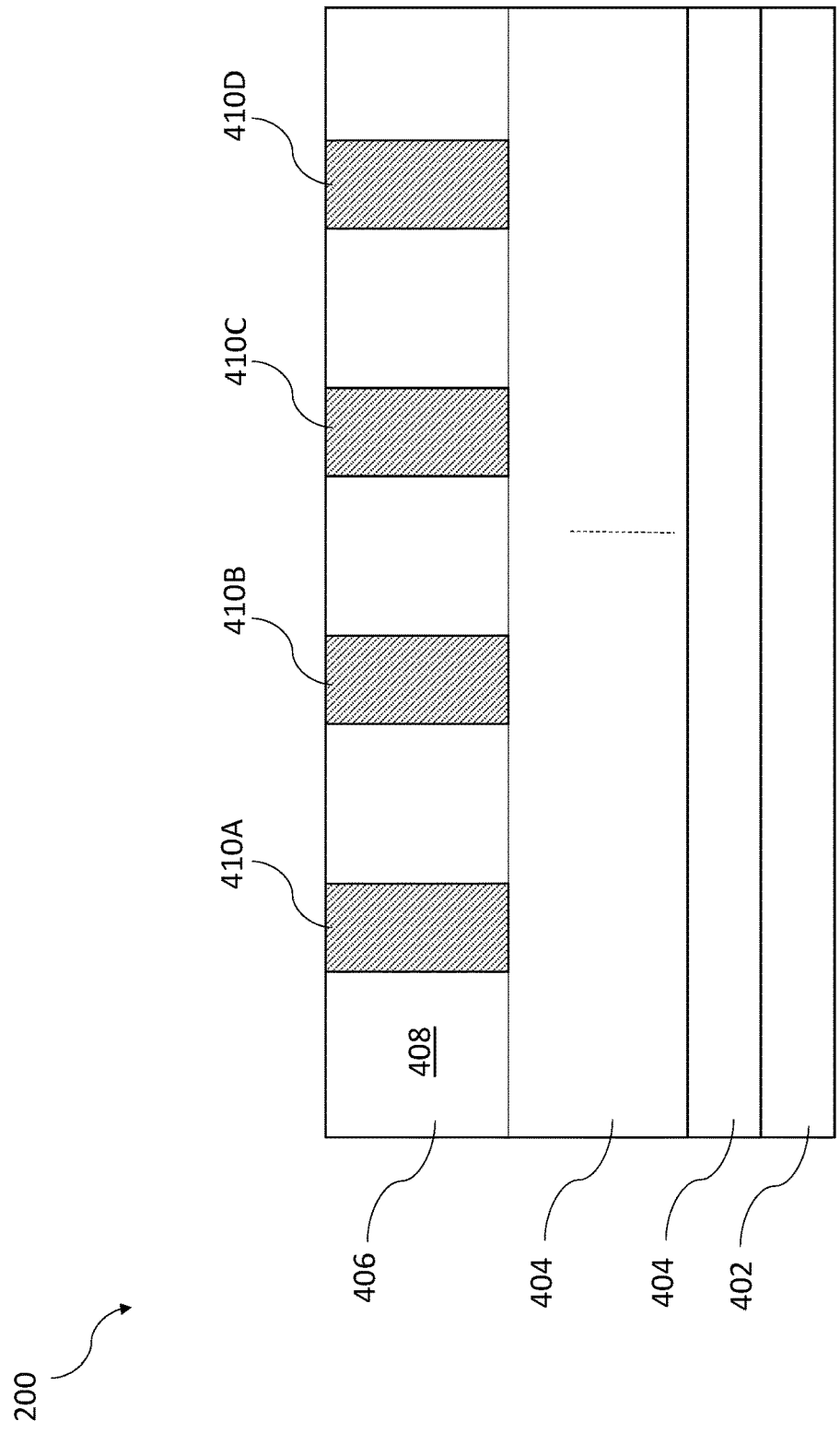

Corresponding to operation 106 of FIG. 1, FIG. 4 is a cross-sectional view of the semiconductor package 200 in which a second substrate 402 is provided with a number of second interconnect structures 410A, 410B, 410C, and 410D, at one of the various stages of fabrication, in accordance with various embodiments.

The second substrate 402 may be a semiconductor substrate, such as a bulk semiconductor, a semiconductor-on-insulator (SOI) substrate, or the like, which may be doped (e.g., with a p-type or an n-type dopant) or undoped. The second substrate 402 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the second substrate 402 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the second substrate 402 includes a number of device features (e.g., transistors, diodes, resistors, etc., which are not shown for the sake of clarity) formed along a (e.g., frontside) surface of the second substrate 402 and a number of interconnect structures (e.g., metal lines, metal vias, etc., which are not shown for the sake of clarity) formed over the device features. The interconnect structures are configured to electrically connect the device features to one another so as to form an integrated circuit, which can function as a logic device, a memory device, an input/output device, or the like. These interconnect structures (e.g., formed of conductive materials, such as Cu, Al, W, Ti, TiN, Ta, TaN, or multiple layers or combinations thereof) may be embedded in one or more dielectric layers (e.g., formed of low-k dielectric materials, such as $SiO_2$), which are sometimes referred to as metallization layers, e.g., 404. Alternatively stated, each metallization layer 204 can include a number of metal lines and a number of metal vias embedded therein. Over the (e.g., frontside) surface of the second substrate 402, a plural number of such metallization layers 404 can be formed.

Further, on a topmost one of the metallization layers, a bonding layer 406 is formed. In some embodiments, the bonding layer 406, formed of one or more low-k dielectric materials 408, such as $SiO_2$, has a number of second interconnect structures 410A to 410D disposed therein. The first interconnect structures 410A to 410D are formed using a damascene process, wherein the dielectric material 408 is deposited over the workpiece (e.g., the topmost metallization layer), and the dielectric material 408 is patterned using lithography. The patterned dielectric material 408 is filled with a conductive material, and excess portions of the conductive material are removed from over the top surface of the dielectric material 408 using a chemical mechanical polishing (CMP) process, an etch process, or combinations thereof. In other embodiments, a conductive material may be deposited and patterned using lithography, and the dielectric material 408 is formed over the conductive material to form the second interconnect structures 410A to 410D using a subtractive etch process. The excess dielectric material 408 is then removed from over the second interconnect structures 410A to 410D using a CMP process, an etch process, or combinations thereof.

Figure 5:
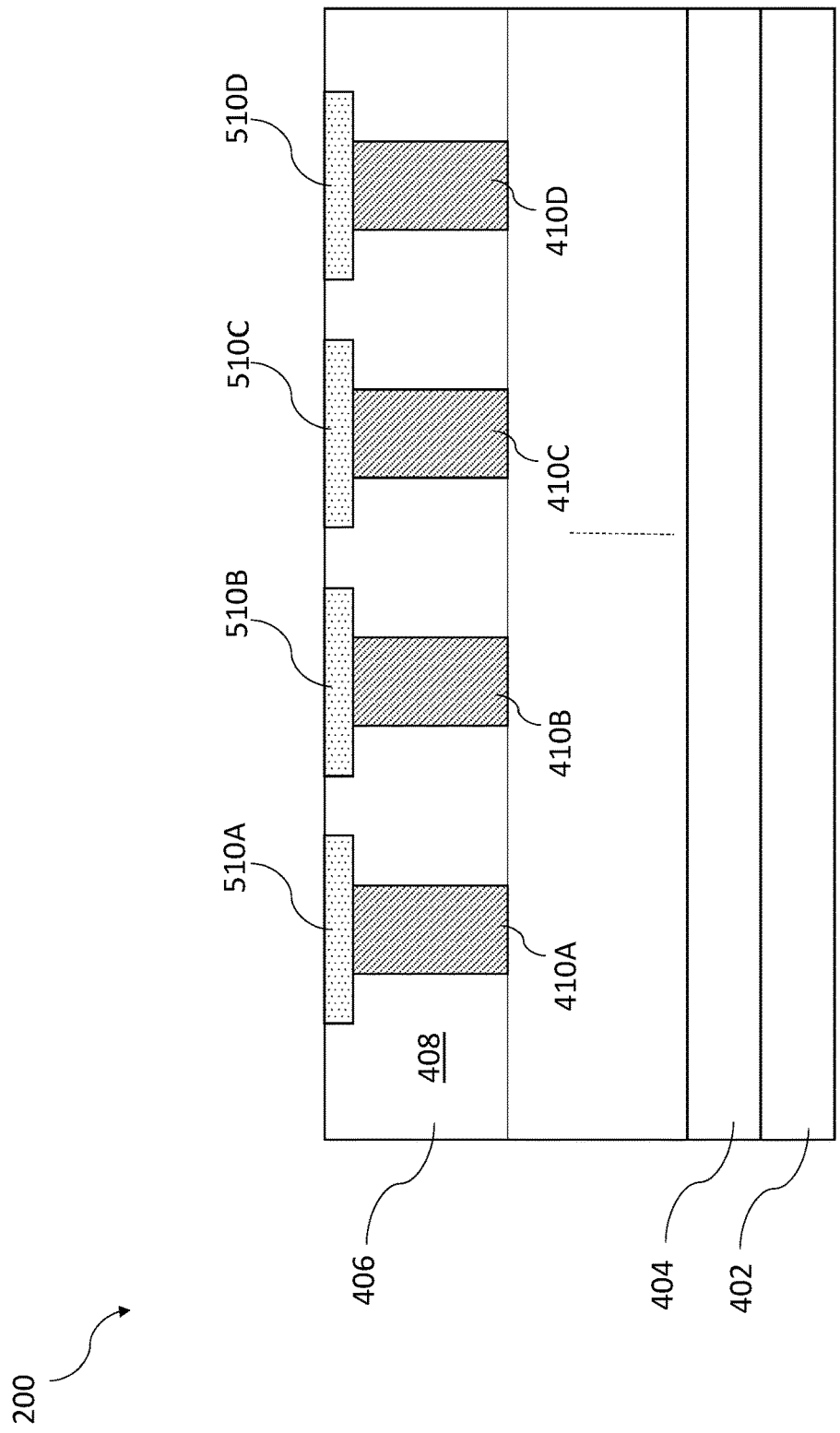

Corresponding to operation 108 of FIG. 1, FIG. 5 is a cross-sectional view of the semiconductor package 200 in which a number of second connection pads 510A, 510B, 510C, and 510D are formed over the second interconnect structures 410A, 410B, 410C, and 410D, respectively, at one of the various stages of fabrication, in accordance with various embodiments.

Following the formation of the second interconnect structures 410A to 410D, another damascene process may be performed to form the corresponding second connection pads 510A to 510D. For example, another thin layer of the dielectric material 408 may be deposited over the polished surface shared by the original dielectric material 408 and second interconnect structures 410A to 410D. Another patterning process is then performed on the later deposited dielectric material 408 to re-expose respective top surfaces of the dielectric material 408 by forming a number of recesses. Next, these recesses are filled with a PCM, followed by a CMP process, to form the second connection pads 510A to 510D. As such, a bottom surface of each of the second connection pads 510A to 510D can be in direct contact with the top surface of the corresponding second interconnect structure, and a top surface of each of the second connection pads 510A to 510D can be exposed for further connection. In other embodiments, after forming the second interconnect structures 410A to 410D, the second interconnect structures 410A to 410D may be etched to form a number recesses, respectively, which are then filled with the PCM to form the second connection pads 510A to 510D. In some embodiments, the second substrate 402, the metallization layer(s) 404, and the bonding layer 406 (including the second connection pads 510A to 510D) may collectively be referred to a second semiconductor die.

In some embodiments, each of the second connection pads 510A to 510D may laterally extend beyond a sidewall of the corresponding one of the second interconnect structures 410A to 410D, as shown in FIG. 5. However, in some other embodiments, the second connection pads 510A to 510D may each have its sidewall vertically aligned with the sidewall of the corresponding second interconnect structure, while remaining within the scope of the present disclosure. Moreover, in some other embodiments, the second connection pads 510A to 510D may have a cross-section that is smaller than the corresponding one of the second interconnect structures 410A to 410D.

In various embodiments, the PCM of the second connection pads 510A to 510D can be switched between a high resistance state (HRS) and a low resistance state (LRS), or between a conductive state and a non-conductive state. For example, the second connection pads 510A to 510D may each include a binary system of Ga—Sb, In—Sb, In—Se, Sb—Te, Ge—Te, Ge—Sb, or combinations thereof. In another example, the second connection pads 510A to 510D may each include a ternary system of Ge—Sb—Te, In—Sb—Te, Ga—Se—Te, Sn—Sb—Te, In—Sb—Ge, Ga—Sb—Te, or combinations thereof. In yet another example, the second connection pads 510A to 510D may each include a quaternary system of Ag—In—Sb—Te, Ge—Sn—Sb—Te, Ge—Sb—Se—Te, Te—Ge—Sb—S, Ge—Sb—Te—O, Ge—Sb—Te—N, or combinations thereof.

Figure 6:
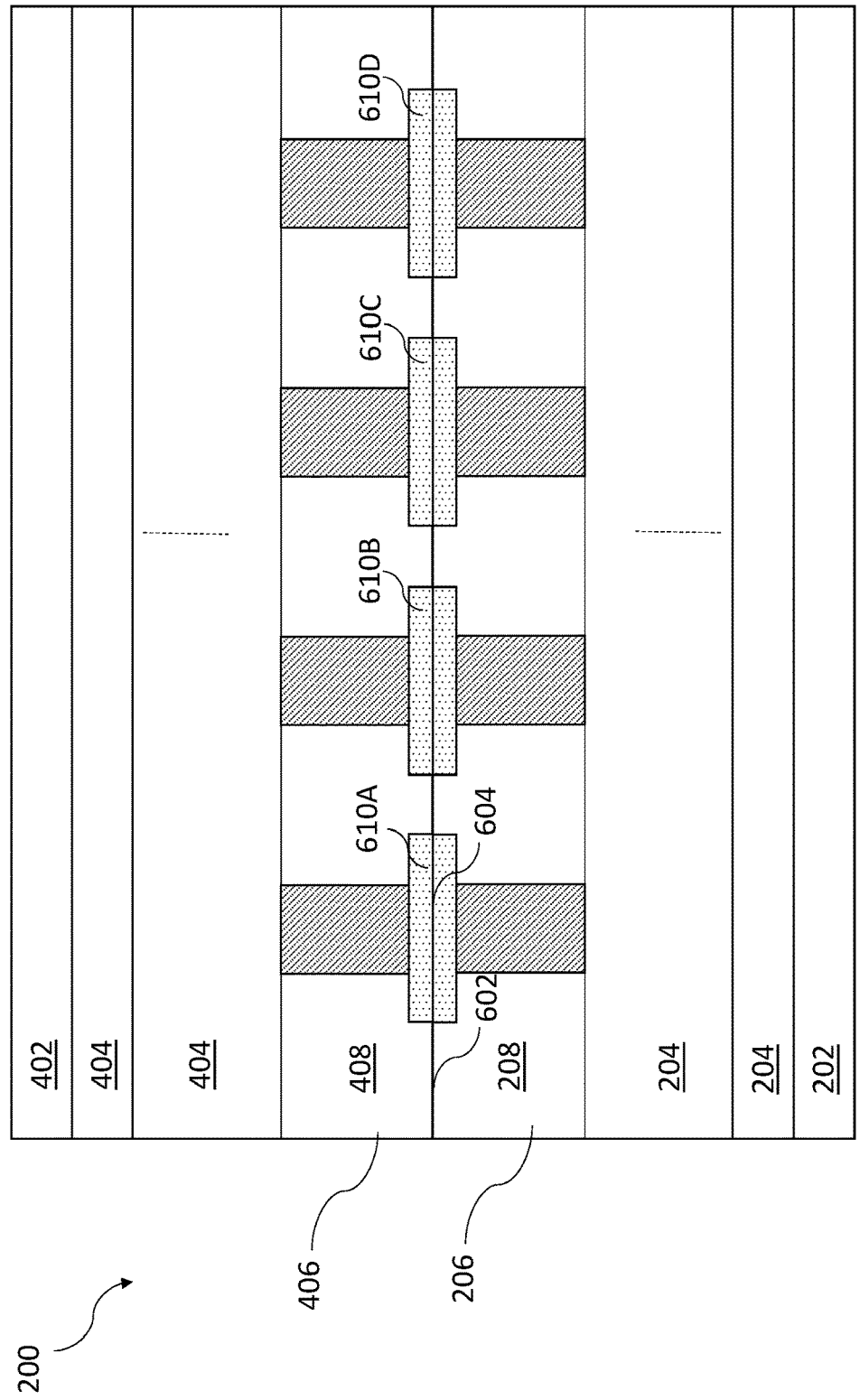

Corresponding to operation 110 of FIG. 1, FIG. 6 is a cross-sectional view of the semiconductor package 200 in which the first substrate 202 (the first semiconductor die) is coupled to the second substrate 402 (or the second semiconductor die), at one of the various stages of fabrication, in accordance with various embodiments.

In some embodiments, the first semiconductor die and the second semiconductor die are bonded together using a hybrid bonding process by coupling a top surface of the first semiconductor die (e.g., the top surface of the bonding layer 206) to a top surface of the second semiconductor die (e.g., the top surface of the bonding layer 406). For example, the second semiconductor die is inverted, i.e., rotated 180 degrees, from the view shown in FIG. 5. Next, the first connection pads 310A to 310D of the first semiconductor die are aligned with the second connection pads 510A to 510D of the second semiconductor die, respectively. The alignment of the first and second semiconductor dies may be achieved using optical sensing, as an example. The top surfaces of portions of the dielectric material 208 (that are coplanar with the top surfaces of the first connection pads 310A to 310D) are also aligned with the top surfaces of portions of the dielectric material 408 (that are coplanar with the top surfaces of the second connection pads 510A to 510D).

After the alignment process of the first and second semiconductor dies, the first and second semiconductor dies are hybrid bonded together by applying pressure and heat. The pressure applied may comprise a pressure of less than about 30 MPa, and the heat applied may comprise an anneal process at a temperature of about 100 to 500 degrees C., as examples, although alternatively, other amounts of pressure and heat may be used for the hybrid bonding process. The hybrid bonding process may be performed in a $N_2$ environment, an Ar environment, a He environment, an (about 4 to 10% $H_2$)/(about 90 to 96% inert gas or $N_2$) environment, an inert-mixing gas environment, combinations thereof, or other types of environments.

The hybrid bonding process results in a bond 602 formed between the dielectric materials 208 and 408, respectively, and a bond 604 is also formed between the connector pads 310A to 310D and 510A to 510D, respectively. The bonded (connected) connector pads, 310A and 510A, 310A and 510A, 310A and 510A, and 310A and 510A, may be collectively referred to as connector pads 610A, 610B, 610C, and 610D, respectively. Specifically, the bonds 602 comprise non-metal-to-non-metal bonds, and the bonds 604 comprise metal-to-metal bonds. A portion of the hybrid bonding process may comprise a fusion process that forms the non-metal-to-non-metal bonds 602, and a portion of the hybrid bonding process may comprise a copper-to-copper bonding process that forms the metal-to-metal bonds 604, for example. The term "hybrid" refers to the formation of the two different types of bonds (e.g., 602 and 604) using a single bonding process, rather than forming only one type of the bonds 602 or 604, as is the practice in other types of wafer-to-wafer or die-to-die bonding processes, for example.

In some other embodiments, at least one of the connection pads 610A to 610D may be formed by only one connection pad. Some of the interconnect structures 210A to 210D or some of the interconnect structures 410A to 410D may not be overlaid by a corresponding connection pad (e.g., no connection pad being formed thereon), and thus, when the first substrate 202 is bonded to the second substrate 402, some of the connection pads 610A to 610D may only be composed of one connection pad. For example, when forming the first connection pads (FIG. 3), the top surface of the first interconnect structure 210A may be coplanar with the top surfaces of the connection pads 310B to 310D, i.e., no connection pad being formed over the first interconnect structure 210A. When forming the second connection pads (FIG. 5), each of the second interconnect structures 410A to 410D is still overlaid by a corresponding one of the connection pads 510A to 510D. As such, after the second substrate 402 is bonded to the first substrate 202, the connection pad 610A may only include the connection pad 510A, while the other connection pads 610B to 610D still each include a combination of connection pads.

Figure 7:
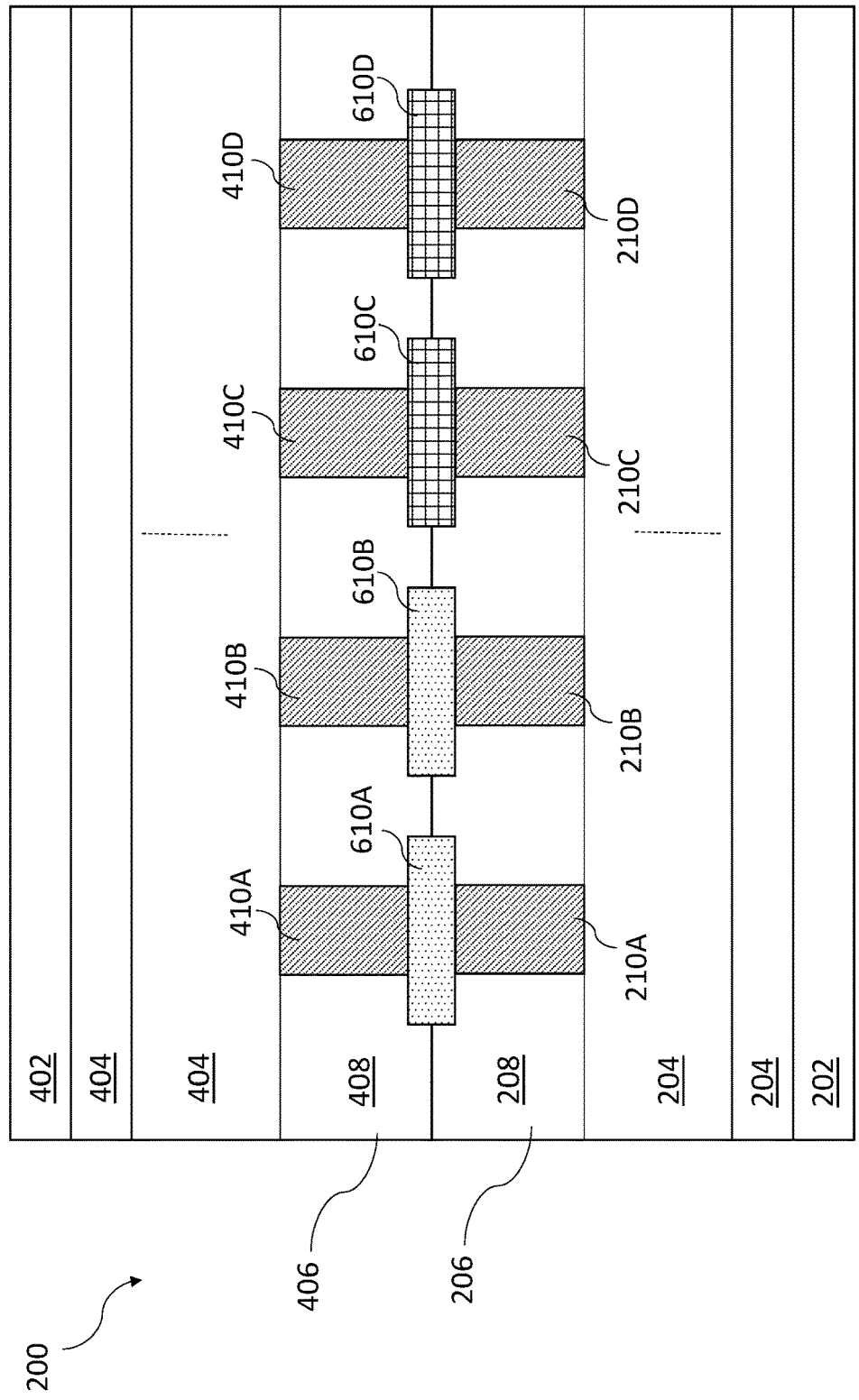

Corresponding to operation 112 of FIG. 1, FIG. 7 is a cross-sectional view of the semiconductor package 200 in which the connector pads 610A, 610B, 610C, and 610D are each transitioned between a FIRS and a LRS, at one of the various stages of fabrication, in accordance with various embodiments.

Subsequently to bonding the first semiconductor die to the second semiconductor die, the connector pads 610A to 610D may be each switched between the HRS and LRS. In some embodiments, upon being formed, the connector pads 610A to 610D may be each in a crystalline phase. As such, the connector pads 610A to 610D, as formed, may be each in a LRS (i.e., conductive). That is, the first interconnect structure 210A is electrically connected to the second interconnect structure 410A through the conductive connector pad 610A; the first interconnect structure 210B is electrically connected to the second interconnect structure 410B through the conductive connector pad 610B; the first interconnect structure 210C is electrically connected to the second interconnect structure 410C through the conductive connector pad 610C; and the first interconnect structure 210D is electrically connected to the second interconnect structure 410D through the conductive connector pad 610D.

In some embodiments, at least one of the first interconnect structure or the second interconnect structure is configured to provide Joule heating to the connection pad interposed therebetween so as to cause the connection pad to switch between the HRS and the LRS.

Specifically, at least one of the first interconnect structure or the second interconnect structure is configured to apply a current to the connection pad, causing the connection pad to transition from the crystalline phase (LRS) to an amorphous phase (HRS), thereby causing the previously connected interconnect structures to disconnect from each other. The current can anneal the connection pad at a temperature high than a melting temperature of the material of the connection pads 610A to 610D for a certain period of time. For example in FIG. 7, at least one of the interconnect structure 210C or interconnect structure 410C may be applied with such a current to transition the connection pad 610C from the LRS to the HRS so as to electrically disconnect the interconnect structure 210C from the interconnect structure 410C. Similarly, at least one of the interconnect structure 210D or interconnect structure 410D may be applied with such a current to transition the connection pad 610D from the LRS to the HRS so as to electrically disconnect the interconnect structure 210D from the interconnect structure 410D. Further, at least one of the first interconnect structure or the second interconnect structure is configured to apply another current to the connection pad, causing the connection pad to transition from the FIRS to the LRS, thereby causing the previously disconnected interconnect structures to connect to each other. The current can anneal the connection pad at a temperature above a crystallization temperature of the material of the connection pads 610A to 610D but below a melting temperature of the material of the connection pads 610A to 610D.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A structure, comprising:
   a first semiconductor die including a first interconnect structure disposed over a first active surface of a first semiconductive substrate;
   a second semiconductor die including a second interconnect structure disposed over a second active surface of a second semiconductive substrate, the second semiconductor die hybrid-bonded to the first semiconductor die at a bonding interface extending along a plane, the bonding interface comprising a plurality of metal-to-metal bonds and a plurality of non-metal-to-non-metal bonds; and
   a connection pad, disposed along the interface, interposed between the first interconnect structure and the second interconnect structure, wherein a portion of the connection pad in direct contact with each of the first interconnect structure and the second interconnect structure includes a phase change material configured to switch between:
      a first resistance state configured to electrically couple first device features of the first semiconductor die with second device features of the second semiconductor die to form a three-dimensional integrated circuit; and
      a second resistance state configured to electrically decouple the first device features from the second device features.

2. The structure of claim 1, wherein the phase change material of the connection pad is selected from the group consisting of: a binary system of Ga—Sb, In—Sb, In—Se, Sb—Te, Ge—Te, and Ge—Sb.

3. The structure of claim 1, wherein the phase change material of the connection pad is selected from the group consisting of: a ternary system of Ge—Sb—Te, In—Sb—Te, Ga—Se—Te, Sn—Sb—Te, In—Sb—Ge, and Ga—Sb—Te.

4. The structure of claim 1, wherein the phase change material of the connection pad is selected from the group consisting of: a quaternary system of Ag—In—Sb—Te, Ge—Sn—Sb—Te, Ge—Sb—Se—Te, Te—Ge—Sb—S, Ge—Sb—Te—O, and Ge—Sb—Te—N.

5. The structure of claim 1, wherein at least one of the first interconnect structure or the second interconnect structure is configured to provide Joule heating to the connection pad so as to cause the connection pad to switch between the first resistance state and the second resistance state.

6. The structure of claim 1, wherein at least one of the first interconnect structure or the second interconnect structure is configured to apply a current to the connection pad, causing the connection pad to transition to a crystalline phase.

7. The structure of claim 1, wherein at least one of the first interconnect structure or the second interconnect structure is configured to apply a current to the connection pad, causing the connection pad to transition to an amorphous phase.

8. The structure of claim 1, wherein the first semiconductor die further includes a first dielectric layer embedding the first interconnect structure and a first portion of the connection pad, and the second semiconductor die further includes a second dielectric layer embedding the second interconnect structure and a second portion of the connection pad.

9. A structure, comprising:
   a first substrate including a first dielectric layer that embeds a first interconnect structure;
   a second substrate including a second dielectric layer that embeds a second interconnect structure; and
   a connection pad having a first portion embedded in the first dielectric layer and a second portion embedded in the second dielectric layer, wherein a first surface of the first portion is in contact with the first interconnect structure and a first surface of the second portion is in contact with the second interconnect structure, and respective second surfaces of the first and second portions are in direct contact with each other at a bonding interface between the first substrate and the second substrate,
   wherein each of the first and the second portions of the connection pad includes a phase change material.

10. The structure of claim 9, wherein the first dielectric layer is in contact with the second dielectric layer.

11. The structure of claim 9, wherein the phase change material is selected from the group consisting of: a binary system of Ga—Sb, In—Sb, In—Se, Sb—Te, Ge—Te, and Ge Sb.

12. The structure of claim 9, wherein the phase change material is selected from the group consisting of: a ternary system of Ge—Sb—Te, In—Sb—Te, Ga—Se—Te, Sn—Sb—Te, In—Sb—Ge, and Ga—Sb—Te.

13. The structure of claim 9, wherein the phase change material is selected from the group consisting of: a quaternary system of Ag—In—Sb—Te, Ge—Sn—Sb—Te, Ge—Sb—Se—Te, Te—Ge—Sb—S, Ge—Sb—Te—O, and Ge—Sb—Te—N.

14. The structure of claim 9, wherein at least one of the first interconnect structure or the second interconnect structure is configured to provide Joule heating to the connection pad so as to cause the connection pad to switch between a first resistance state and a second resistance state.

15. A structure, comprising:
a first substrate including a first interconnect structure;
a second substrate including a second interconnect structure, the second substrate bonded to the first substrate at a bonding interface; and
a connection pad including a first portion in direct contact with the first interconnect structure and a second portion in direct contact with the second interconnect structure,
wherein the first portion and the second portion each include a phase change material configured to switch between a first resistance state and a second resistance state, and
wherein the bonding interface extends through the connection pad.

16. The structure of claim 15, wherein the phase change material is selected from the group consisting of: a binary system of Ga—Sb, In—Sb, In—Se, Sb—Te, Ge—Te, and Ge—Sb.

17. The structure of claim 15, wherein the phase change material is selected from the group consisting of: a quaternary system of Ag—In—Sb—Te, Ge—Sn—Sb—Te, Ge—Sb—Se—Te, Te—Ge—Sb—S, Ge—Sb—Te—O, and Ge—Sb—Te—N.

18. The structure of claim 15, wherein the phase change material is selected from the group consisting of: a quaternary system of Ag—In—Sb—Te, Ge—Sn—Sb—Te, Ge—Sb—Se—Te, Te—Ge—Sb—S, Ge—Sb—Te—O, and Ge—Sb—Te—N.

19. The structure of claim 15, wherein at least one of the first interconnect structure or the second interconnect structure is configured to provide Joule heating to the connection pad so as to cause the connection pad to switch between the first resistance state and the second resistance state.

20. The structure of claim 15, wherein at least one of the first interconnect structure or the second interconnect structure is configured to apply a current to the connection pad, causing the connection pad to transition between an amorphous phase and a crystalline phase.

* * * * *